(12) United States Patent
Lu et al.

(10) Patent No.: US 8,230,589 B2
(45) Date of Patent: Jul. 31, 2012

(54) METHOD OF MOUNTING AN OPTICAL DEVICE

(75) Inventors: Daoqiang Lu, Chandler, AZ (US); Johanna Swan, Scottsdale, AZ (US); Henning Braunisch, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1137 days.

(21) Appl. No.: 12/054,777

(22) Filed: Mar. 25, 2008

(65) Prior Publication Data

US 2009/0244873 A1 Oct. 1, 2009

(51) Int. Cl.
*H05K 3/34* (2006.01)

(52) U.S. Cl. .......... 29/840; 29/830; 29/832; 29/852; 385/52

(58) Field of Classification Search .......... 29/830, 29/832, 840, 852; 385/52
See application file for complete search history.

(56) References Cited

U.S. PATENT DOCUMENTS

| | | | |
|---|---|---|---|
| 5,834,799 A * | 11/1998 | Rostoker et al. | 257/98 |
| 6,281,042 B1 * | 8/2001 | Ahn et al. | 438/108 |
| 6,586,835 B1 * | 7/2003 | Ahn et al. | 257/717 |
| 7,022,553 B2 * | 4/2006 | Ahn et al. | 438/122 |
| 7,068,892 B1 * | 6/2006 | Lu et al. | 385/52 |
| 7,453,058 B2 * | 11/2008 | Lee et al. | 250/239 |
| 7,684,660 B2 * | 3/2010 | Braunisch et al. | 385/14 |

OTHER PUBLICATIONS

Controlled Solder Self-Aligned Sequence for an Optoelectronic Module without Mechanical Stops, a paper by N.D. Morozowa et al, 1997 IEEE Electronic Components and Technology Conference, pp. 1188-1193.*

Morozova, N.D.; Liew,L.-A; Zhang, W.; Irwin, R.; Su, B.; Lee, Y.C. "Controlled Solder Self-Alignment Sequence for an Optoelectronicmodule without Mechanical Stops" Electronic Components and Technology Conference, 1997. Proceedings., 47th vol. Issue, May 18-21, 1997 pp. 1188-1193.

* cited by examiner

*Primary Examiner* — Carl Arbes
(74) *Attorney, Agent, or Firm* — Schwabe, Williamson & Wyatt, P.C.

(57) ABSTRACT

A method for aligning at least two photonic components over an interposer, and an optical package that may align such components. The method may include providing an interposer; fabricating electrical conductors passing from one surface of the interposer to an opposite surface of the interposer at selected contact positions; soldering the photonic components over the selected contact positions on the first surface, while allowing solder self-alignment. Other embodiments are described and claimed.

17 Claims, 4 Drawing Sheets

METHOD OF MOUNTING AN OPTICAL DEVICE

FIELD OF THE INVENTION

The present invention relates to optical interconnects, and more specifically to an optical package.

BACKGROUND OF THE INVENTION

On-die optical interconnects may require an external laser source and, if utilized for I/O (input/output), an optical connector at the package level.

Optical alignment between an external laser or connector and an on-die optical waveguides is very challenging. The to-date alignment technique is active alignment which is slow and intricate, and requires special skills.

BRIEF DESCRIPTION OF THE DRAWINGS

In order to better understand the present invention, and appreciate its practical applications, the following figures are provided and referenced hereafter. It should be noted that the figures are given as examples only and in no way limit the scope of the invention. Like components are denoted by like reference numerals.

DETAILED DESCRIPTION OF EMBODIMENTS

In the following detailed description, numerous specific details are set forth in order to provide a thorough understanding of the invention. However it will be understood by those of ordinary skill in the art that the present invention may be practiced without these specific details. In other instances, well-known methods, procedures, components and circuits have not been described in detail so as not to obscure the present invention.

Solder self-alignment can provide a positional alignment precision of less than 2 μm as it is known. It is suggested, according to some embodiments of the present invention, to fabricate traces and pads on a silicon interposer using, for example, lithography, which may provide very tight tolerance control. The volume of the solder bumps may be precisely controlled, for example, by evaporation or plating the solder so that the standoff height of the solder joints of the dies over the interposer can be precisely controlled and good z-axis optical alignment can be achieved between any two devices.

Optical packages according to embodiments of the present invention facilitate passive optical alignment, which is more compatible with manufacturing, and offer good thermo-mechanical reliability. The silicon interposer may have a coefficient of thermal expansion (CTE) matched to that of the high-performance photonic dies that may contain fragile materials such as low-k ILD (k=dielectric constant; ILD=interlayer dielectric).

Processing steps for making an optical package according to an embodiment of the present invention are illustrated in FIGS. 1-4 and therefore reference is made to these figures.

Figure 1:
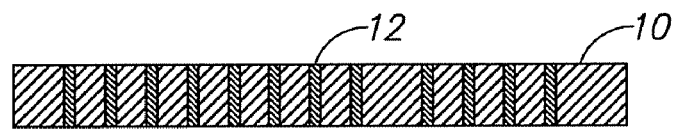
FIG. 1 illustrates a silicon interposer which is an initial fabrication stage of an optical package according to embodiments of the present invention.

FIG. 1 illustrates a silicon interposer (denoted 10), which is an initial fabrication stage of a high-performance optical package according to an embodiment of the present invention. Fabrication of the silicon interposer can be done by through silicon vias (TSVs, denoted 12) on a thin (for example, 200-300 μm thick, although other dimensions may be used) silicon (Si) wafer. The silicon interposer may for example be made of one or more active devices, such as an integrated silicon voltage regulator (ISVR) or dynamic random access memory (DRAM). Electrical conductors (e.g., vias) may be fabricated, passing from a first surface of the interposer to an opposite surface of the interposer at selected contact positions.

Figure 2:
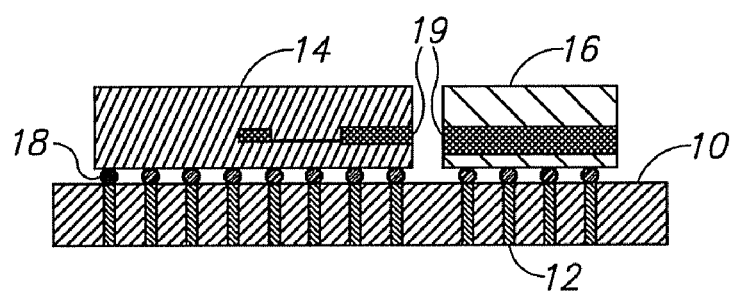
FIG. 2 illustrates mounting photonic components on the silicon interposer, which is a second fabrication stage of a high-performance optical package according to embodiments of the present invention.

FIG. 2 illustrates mounting photonic components on the silicon interposer, which is a second fabrication stage of a high-performance optical package according to an embodiment of the present invention. Photonic components, such as, for example, Si logic die (14), and external laser die or connector (16), are attached on the Si interposer through solder bumps (18). During reflowing, the solder bumps melt, change their shape (to minimize their surface energy), and thus align the photonic components with respect to the lithographically (e.g., precisely) defined pads on interposer 10. The final shape of the solder joints determines the x, y, and z position of the photonic components. With a careful design of the solder bumps (e.g., volume control, number of bumps), the optical apertures (19) at the edges of the photonic components may be aligned (e.g., in the x, y and/or z directions) with respect to each other. A connector may be made of for example high-precision molded plastic or silicon. Other materials may be used. A connector may contain alignment features such as holes to accept an external waveguide array. A connector (16) may also be a Si die containing tapered waveguides and other elements such as fabricated microlenses to facilitate coupling to the external waveguide array. Other connector features may be integrated, alternatively or additionally.

Figure 3:
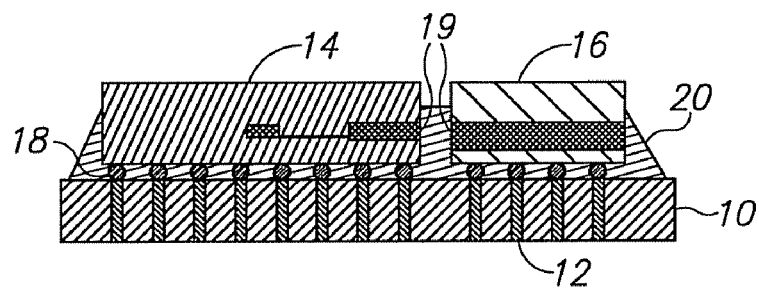
FIG. 3 illustrates underfilling between the photonic components and the silicon interposer, which is a third fabrication stage of a high-performance optical package according to embodiments of the present invention.

FIG. 3 illustrates a third fabrication stage of a high-performance optical package according to an embodiment of the present invention, which comprises introducing an optically transparent underfill (20) between the photonic components (such as Si logic die 14, connector 16) and the silicon interposer (10) to mechanically reinforce the photonic components. Since the underfill may cover the optical apertures (19) on the edges of the photonic components, in some embodiments it has high transmission at the optical wavelengths of operation. The underfill may be for example an epoxy without filler, with an optically transparent glass filler, or with a nano-filler whose size is smaller than the wavelengths of operation.

Figure 4:
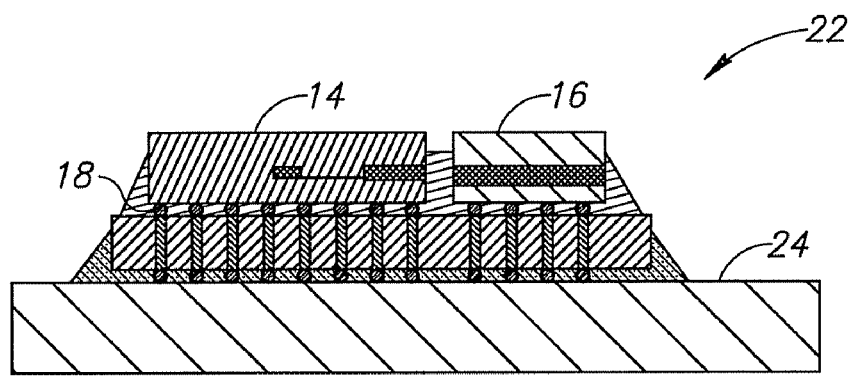
FIG. 4 illustrates assembling the interposer on a package substrate, which is a fourth fabrication stage of a high-performance optical package according to embodiments of the present invention.

FIG. 4 illustrates assembling the interposer (10), with the photonic components (14, 16), for example by soldering it on solder bumps (18), on a package substrate (24), to form an optical package (22), according to an embodiment of the present invention.

Besides controlling solder volume to achieve the z-axis optical alignment, other approaches such as carefully designed mechanical stoppers which are pre-fabricated on the silicon interposer, solder balls with hard cores (such as solder coated polymer balls, metal balls or glass balls) may also be employed, for z-axis (e.g., vertical) optical alignment, according to embodiments of the present invention.

While high-speed I/O can be handled optically by directly connecting to the top of the interposer through the optical connector described above, a plain interposer may impede power delivery in case of a high-performance microprocessor. This can be overcome by substituting an integrated silicon voltage regulator (ISVR) device with through silicon vias (TSVs), in stacked configuration also referred to as three-dimensional voltage regulator (3DVR), for the interposer. Stacking onto devices containing DRAM may also be implemented, according to embodiments of the present invention.

Examples of potential applications and systems according to embodiments of the invention are depicted in the following figures.

Figure 5:
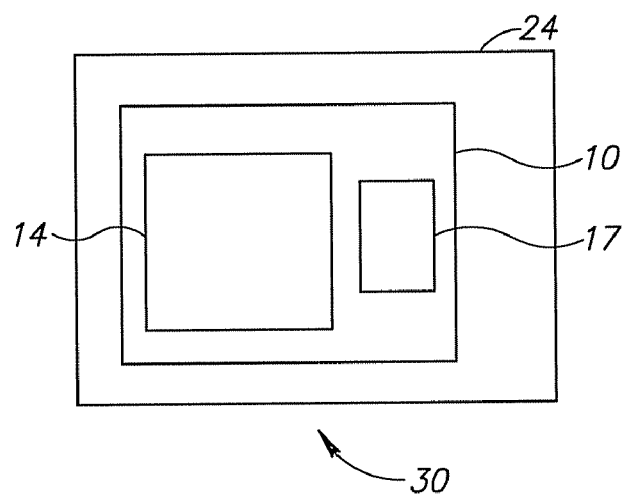
FIG. 5 illustrates optical on-die global interconnects and/or optical clocking of a device, according to embodiments of the present invention.

FIG. 5 illustrates optical on-die global interconnects and/or optical clocking of a device, according to an embodiment of the present invention.

Shown is an optical package (30) that may include a Si logic die with an on-die waveguide, modulator or detector (14) and a laser source (17), both of which are mounted and aligned on an Si interposer (10) that is mounted on an organic package substrate (24).

Figure 6:
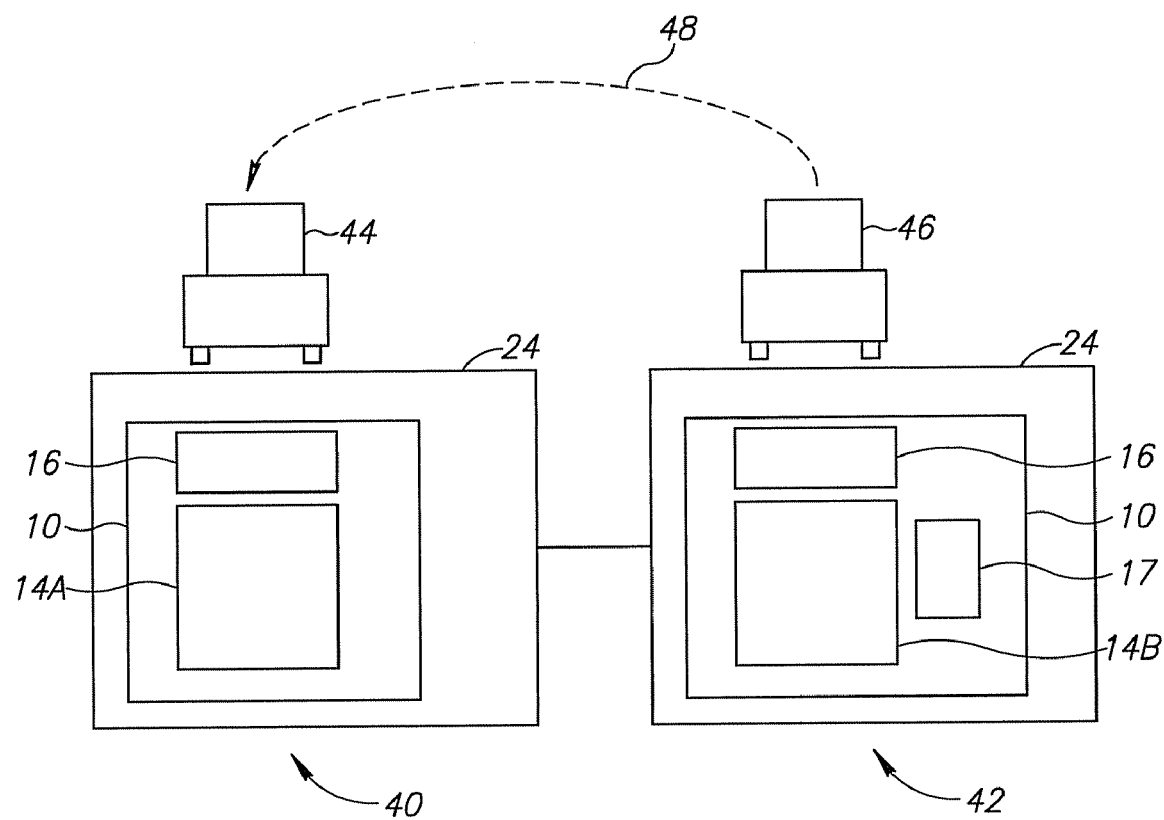
FIG. 6 illustrates an optical input-output connect device according to embodiments of the present invention.

FIG. 6 illustrates a system of optical packages, with an optical input-output connect device according to an embodiment of the present invention. The optical package (40) on the left-hand side includes a Si logic die (14a) with an on-die waveguide and detector with connector (16), to which an external waveguide connector (44) is connected. The optical package (42) on the right-hand side includes a Si logic die (14b) with an on-die waveguide and modulator with connector (16) and a laser source (17). Light emitted by the laser source (17) may travel through Si logic die (14b), through connector (16) into external waveguide connector 46, and through an optical path (48, for example an optical fiber array) into external waveguide connector (44), through to connector (16) to Si logic die (14a). FIG. 6 shows only the components associated with a unidirectional interconnect (from right to left). A full system may include other components such as lasers, modulators, and detectors at both ends to allow bidirectional interconnection and information transfer.

Figure 7:
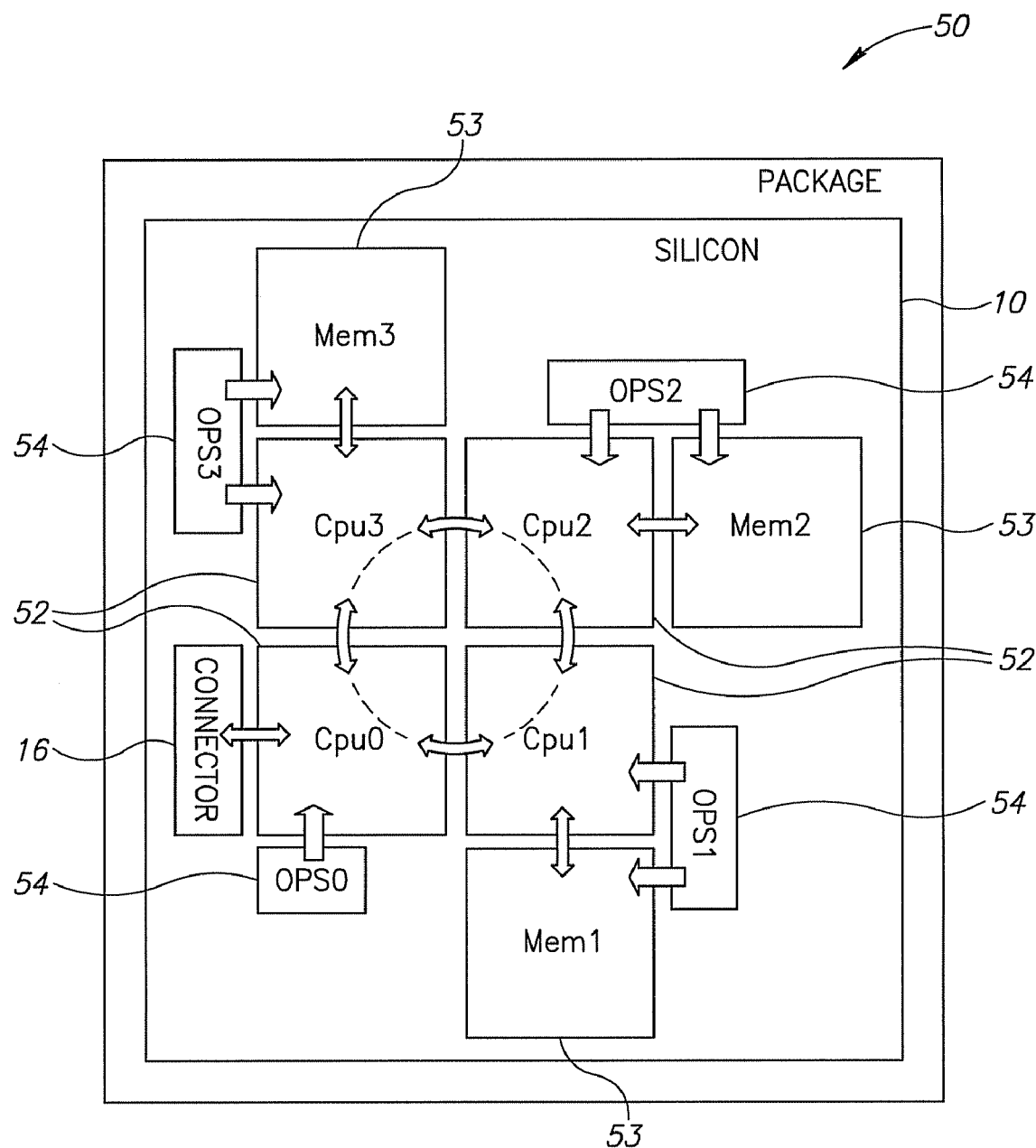
FIG. 7 illustrates an optical supercomputer on a package, according to embodiments of the present invention.

FIG. 7 illustrates an optical supercomputer on a package (50), according to an embodiment of the present invention.

Block arrows between photonic dies indicate the direction of flow of light. Central processing units CPU0 to CPU3 (52) communicate with each other through an optical interconnect system with ring topology (as indicated by the dashed circle). OPS0 to OPS3 (54) may be four lasers for optical power supply (OPS). Mem1 to Mem3 (53) may be optically addressable large local memories and may include stacked memory such as DRAM. CPU0 to CPU3 (52) may be identical for example if they contain an interface configurable either for connectorized system I/O (in case of CPU0) or memory I/O (CPU1 to CPU3).

Figure 8:
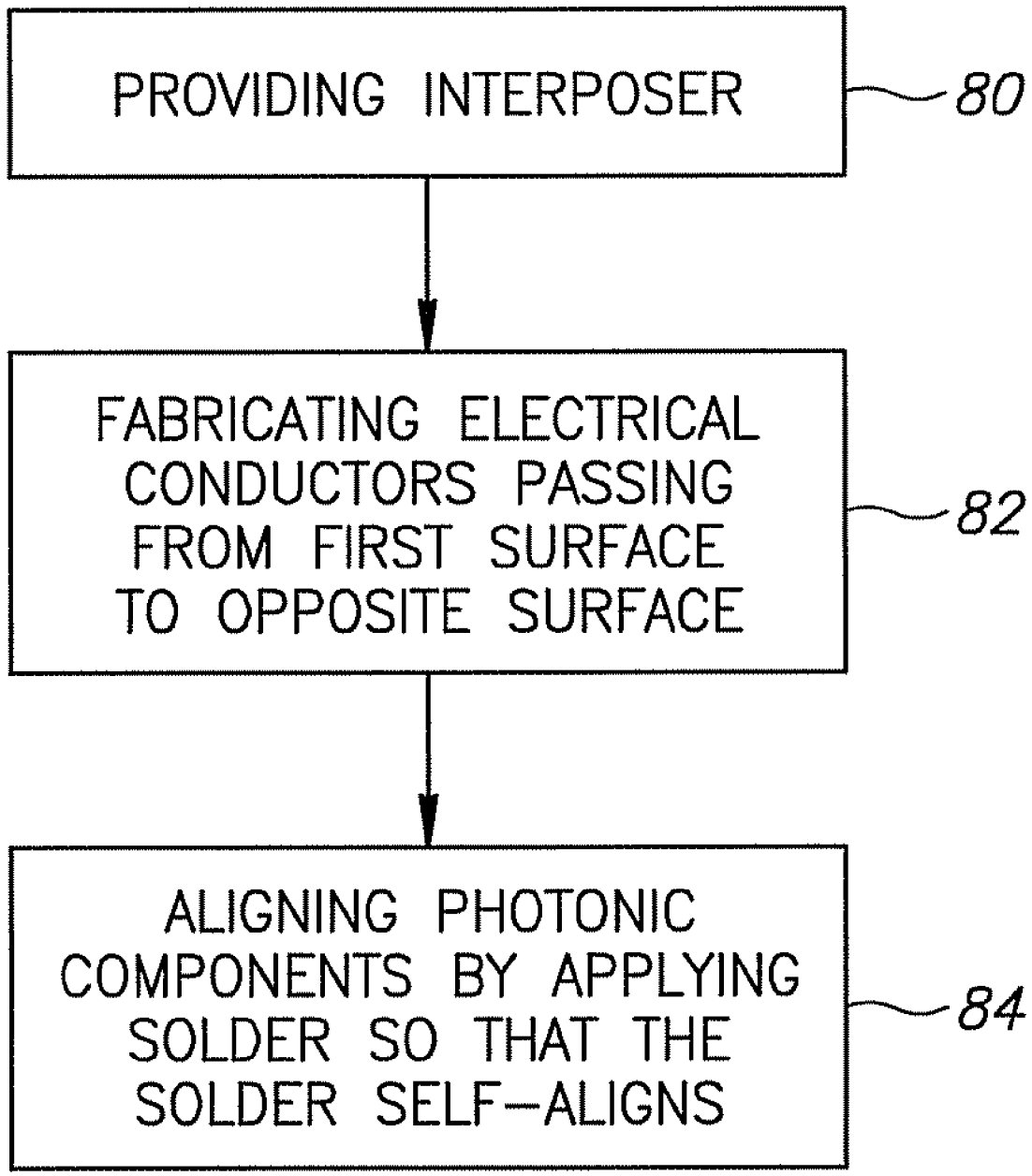
FIG. 8 is a flow chart illustrating a method for providing an optical package according to embodiments of the present invention.

FIG. 8 is a flow chart illustrates a method for providing an optical package according to embodiments of the present invention. One embodiment may include providing an interposer (80), fabricating electrical conductors passing from a first surface of the interposer to an opposite surface of the interposer at selected contact positions (82), and aligning at least two photonic components over the interposer by applying solder so that the solder self-aligns and soldering said at least two photonic components over the selected contact positions on the first surface (84). Other operations or series of operations may be included.

While the invention has been described with respect to a limited number of embodiments, it will be appreciated that many variations, modifications and other applications of the invention may be made. Embodiments of the present invention may include other apparatuses for performing the operations herein. The appended claims are intended to cover all such modifications and changes.

What is claimed is:

1. A method comprising:
   providing an interposer including an active device;
   fabricating an electrical conductor extending from a first surface of the interposer to an opposite surface of the interposer at a contact position;
   soldering a photonic component over the contact position on the first surface; and
   mounting the opposite surface of the interposer onto a substrate such that the interposer is between the photonic component and the substrate.

2. The method of claim 1, wherein the active device is selected from the group consisting of an integrated silicon voltage regulator and a memory.

3. The method of claim 1, wherein the fabricating of the electrical conductor comprises lithographically fabricating the electrical conductor.

4. The method of claim 3, wherein the lithographically fabricating comprises lithographically fabricating a via through the interposer layer.

5. The method of claim 1, wherein the electrical conductor is selected from the group consisting of traces and pads.

6. The method of claim 1, wherein the photonic component is selected from the group consisting of a logic die, a laser source, and a connector.

7. The method of claim 1, wherein the photonic component is a first photonic component, the electrical conductor is a first electrical conductor, and the contact position is a first contact position, and wherein the method further comprises:
   fabricating a second electrical conductor extending from the first surface of the interposer to the opposite surface of the interposer at a second contact position; and
   soldering a second photonic component over the second contact position on the first surface.

8. The method of claim 7, further comprising underfilling between the first photonic component and the second photonic component.

9. The method of claim 8, further comprising underfilling between the interposer and the first and second photonic components.

10. The method of claim 9, wherein the underfilling is performed using an epoxy.

11. The method of claim 1, further comprising aligning the photonic component over the first surface of the interposer by applying solder so that the solder self-aligns.

12. The method of claim 11, wherein the solder comprises cores coated by the solder.

13. The method of claim 12, wherein the cores comprise polymer cores, metal cores, or glass cores.

14. The method of claim 9, wherein the underfilling is performed using an optically transparent underfill.

15. The method of claim 14, wherein the optically transparent underfill is a filler-less epoxy.

16. The method of claim 14, wherein the optically transparent underfill is an optically transparent glass filler.

17. The method of claim 14, wherein the optically transparent underfill is a nanofiller.

\* \* \* \* \*